United States Patent [19]

Lemelson

[11] Patent Number: 5,360,227

[45] Date of Patent: Nov. 1, 1994

[54] SKIS AND RUNNERS

[76] Inventor: Jerome H. Lemelson, 868 Tyner Way, Incline Village, Nev. 89450

[21] Appl. No.: 849,156

[22] Filed: Mar. 10, 1992

Related U.S. Application Data

[63] Continuation-in-part of Ser. No. 494,689, Mar. 16, 1990, Pat. No. 5,255,929, which is a continuation-in-part of Ser. No. 32,352, Mar. 31, 1987, Pat. No. 4,960,643.

[51] Int. Cl.$^5$ .............................................. A63C 5/04
[52] U.S. Cl. .................................... 280/608; 280/610
[58] Field of Search ................. 280/608, 11.18, 609, 280/600, 610, 601, 11.12

[56] References Cited

U.S. PATENT DOCUMENTS

| | | | |
|---|---|---|---|
| 3,687,469 | 8/1972 | Wada | 280/608 |
| 3,918,728 | 11/1975 | Stugger et al. | 280/608 |
| 4,175,766 | 11/1979 | Barwin | 280/608 |
| 4,233,098 | 11/1980 | Urbain | 280/608 |
| 4,859,493 | 8/1989 | Lemelson | 427/242 |
| 4,987,282 | 1/1991 | Chastain | 280/608 |

*Primary Examiner*—Richard M. Camby

[57] ABSTRACT

Improvements in the construction of skis, sleigh runners and the like having extended and improved wear characteristics. In one form a ski is fabricated with lower left and right edging thereof which is subject to wear and dulling during use by frictional attrition defined by a hard synthetic material having the hardness in the range of natural diamond or higher. The hard material may comprise a coating of synthetic diamond formed in situ on a flexible strip of metal or ceramic material by chemical vapor deposition, radiation beam deposition or other means such as lamination sintering. While a single elongated sheet or strip of metal which is entirely or partly coated with a thin layer or film of synthetic diamond may form the bottom layer or lamination of the ski, a plurality of narrower strips of such diamond coated metal may respectively define the lower left and right edge portions of the ski along most of the length of the ski or at least that portion thereof which is subject to frictional attrition during turning movements when skiing. In a particular form of the invention, a metal such as chromium is provided against the synthetic diamond material to protect its outer surface and to serve as a dry lubricant.

20 Claims, 2 Drawing Sheets

SKIS AND RUNNERS

Related Applications

This is a continuation-in-part of U.S. patent application Ser. No. 07/494,689 filed Mar. 16, 1990 as a continuation-in-part of U.S. patent application Ser. No. 032,352 filed Mar. 31, 1987.

SUMMARY OF THE INVENTION

This invention relates to new and improved structures in sporting equipment and the like, such as skis, sleighs, skates and other devices for use on snow and ice which are subject to frictional and impact attrition during use which results in edge wear and damage. The invention particularly utilizes coatings or strips of hard high strength and wear resistant materials such as synthetic diamond, preferably formed as a coating or layer on a substrate by vapor deposition utilizing suitable radiation, such as microwave radiant energy, to strip carbon atoms from hydrocarbon molecules disposed as a gas or vapor adjacent the surface or surfaces to be coated with such carbon atoms and caused to densify and form a hard surfacing synthetic diamond-like material thereof.

Various constructions in blades and ski edge forming structures are presented which are completely or partly coated with synthetic diamond, at least along the wall or walls thereof which are subject to friction and impact attrition during use. In one form a blade, including an edge or edges thereof, is coated with synthetic diamond in a manner to permit the coating to form a suitable edge upon being so formed and coated. In another form, such synthetic diamond coating extends over and around an edge of the blade or a strip of metal or ceramic defining a support therefor and an edge which may cut through snow and ice to effect motion control during skiing and skating.

In the construction of an ice skate blade, the entire blade may be coated with synthetic diamond or just the lower portion thereof su coated to protect the blade edges from frictional and impact wear during skating.

In the construction of a ski, all surfaces or just the edge defining surfaces of a wear strip may be so coated.

In a further ski construction, a metal plate or strip the width of the ski is laminated to the bottom of the ski base and contains a synthetic diamond coating along its lateral edges and the bottom surface thereof. In a particular form, the bottom surface of such plate or strip is coated with synthetic diamond which defines the bottom surface of the ski.

Strips of metal, such as steel, titanium or aluminum, coated with synthetic diamond, may also be bonded against the walls of indentations formed in the ski base to secure them to the ski and provide synthetic diamond edging therefor which will resist wear and impact attrition during use.

Accordingly it is a primary object of this invention to provide new and improved constructions in sporting equipment such as skis, sleigh runners, ice skates and the like.

Another object is to provide an improved ski for use on snow having runner portions which resist impact attrition and frictional wear.

Another object is to provide constructions in downhill skis employing synthetic diamond material to retain the edging of the skis sharp for long periods of use and to eliminate the need to frequently sharpen same.

Another object is to provide improved constructions in downhill snow skis which render the skis stronger and lighter than conventional skis.

Another object is to provide improved edge defining strips for use in the fabrication of skis and sleigh runners.

With the above and such other objects in view as may hereinafter more fully appear, the invention consists of the novel structures and constructions in sporting equipment such as skis, sleigh runners, blades and the like described in the accompanying specification and illustrated in the drawings, but it is to be understood that variations and modifications may be resorted to which fall within the scope of the invention as claimed without departing from the nature and spirit of the invention.

DETAILED DESCRIPTION

Figure 1:
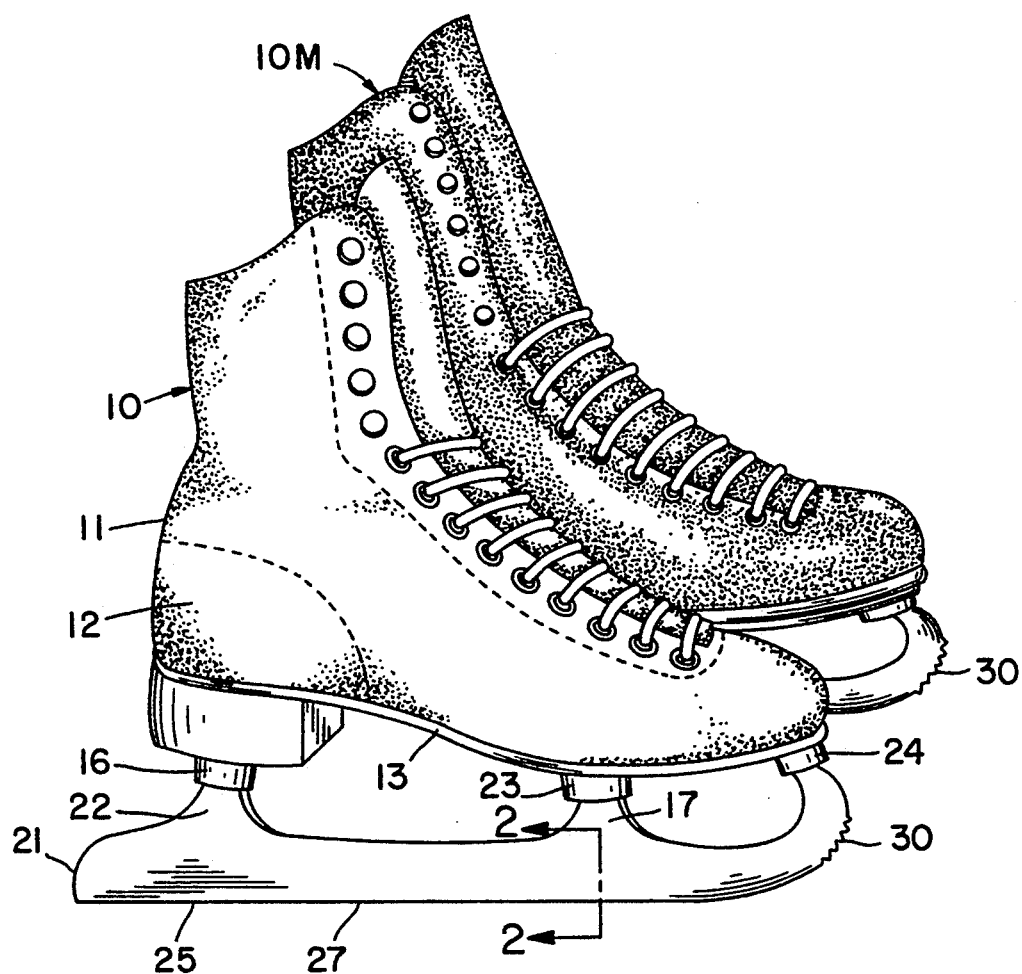
FIG. 1 is an isometric view of two ice skates embodying features of the instant invention.

In FIG. 1 is illustrated typical male and female ice skates 10M and 10, the female skate 10 being shown in greatest detail as comprising a skate shoe 11 conventionally fabricated with a side wall 12 and a bottom wall 13 formed with a heel portion 14 and a forward sole portion 15, both being of sufficient rigidity and strength to support a skate blade assembly 20 secured to such heel and sole portions by suitable fasteners. The blade assembly 20 includes an elongated flat blade portion 21, preferably stamped of steel, aluminum alloy, titanium or other suitable metal. The blade portion 21 may also be machined of steel strip or plate or perhaps even molded of suitable metal or high strength plastic or filament reinforced plastic such as carbon-carbon plastic filament composite. Conventional tubular metal or plastic fastening fittings 16, 17 and 18 are welded or otherwise secured to upwardly extending finger-like portions 22, 23 and 24 of the blade to support the blade away from the bottom of the shoe as shown and are each secured to the bottom wall of the shoe 11 including the heel and sole thereof.

Figure 2:
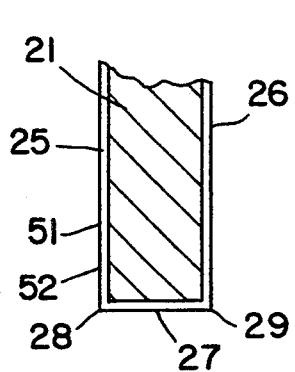
FIG. 2 is an end cross sectional view of a blade for an ice skate, such as one of the skates of FIG. 1, showing further details of features of the invention shown in FIG. 1.

As shown in the enlarged cross sectional view of FIG. 2, the blade 21 has parallel flat side walls 25 and 26 and a bottom wall 27 which is either flat and at right angles to the side walls or is concavely shaped to better define the side edges 28 and 29 of the blade.

Shown coating the side walls 25 and 26 as well as the bottom wall 27 of the blade 21 and extending over anti around the longitudinal side edge portions 28 and 29 thereof is a thin layer 51 of synthetic diamond material formed in situ thereon by chemical vapor deposition of carbon atoms stripped from molecules of a hydrocarbon gas, such as methane or other suitable carbon atom containing fluid disposed adjacent the blade as both the gas and blade are subjected to suitable microwave energy as in the process described in my U.S. Pat. No. 4,859,493 and cop-ending U.S. patent application Ser. No. 032,352 filed Mar. 31,1987.

In one form of the invention, the synthetic diamond coating 51 is deposited as a thin layer of constant thickness against the entire outer surface of the blade 21 and any support fitting or fittings welded thereto. In another form, such coating extends just along the lower portion of the blade including the lower parts of the side wall surfaces 25 and 26 and bottom wall 27 thereof defining therewith the parallel longitudinally extending side edges 28 and 29 thereof. Such latter coating may be limited to the runner portions of the blade which contact the ice during normal skating or may also extend to the front end portion 30 of the blade which includes toe pick formations 31 or the forward point of the blade (not shown) which is employed for sudden stopping by digging same into the ice.

Shown overcoating the synthetic diamond coating 51 of the blade is a thin protective coating 52 of metal such as chromium or other suitable metal or alloy which serves to protect the outer surface of the diamond coating 51 and act as a friction reducing dry lubricant. While the synthetic diamond material defines and preserves the longitudinally extending edges 28 and 29 of the blade from dulling, such a chromium coating which may be applied by chemical vapor deposition utilizing the same microwave energy used to coat form the synthetic diamond coating or by electro-plating, protects the lubricates the outer surface of the diamond coating.

While the skates shown in FIG. 1 are so-called racing skaters, hockey and figure shares employing different blade assembly constructions may be similarly protected by synthetic diamond and, if employed thereon, chromium or other protective overcoatings extending just along the lower portion of the blade or the flat portion of the entire blade of the blade assembly which may include a tubular metal stamping or assembly for supporting and fastening the blade to the shoe.

In a modified form of the invention, the entire plastic or leather side wall 12 of the skate shoe or boot 11 may be coated with a thin layer of synthetic diamond material formed in situ thereon by chemical vapor deposition as described to a thickness in the range of 0.0001" to 0.001" or more and utilized per se to protect the outer surface of the shoe from scuffing, abrasion, moisture and chemical attack from atmospheric pollutants. Such synthetic diamond layer may be utilized per se against the entire outer surface of the shoe as a scuff resistant, water proofing and insulating layer or may be protected and lubricated with hard wax or plastic applied as a thin layer or film to the outer surface thereof. Such polymers as polyethylene, polyurethane, polyester, polycarbonate or other synthetic resin may be applied to the outer surfaces of the plastic or leather side walls as well as the side and bottom walls of the sole and heel of the shoe after the synthetic diamond material has been applied thereto in suitable thickness or thicknesses to provide waterproofing, heat insulation, surface strength abrasion and tear resistance wherein the shoe and skate blade will exhibit superior wear resistance, durability and heat insulation imparted either by the diamond film per se or a combination of the diamond layer and plastic overcoating thereon.

In another form of the invention, both the shoe and blade assembly 20 may be molded of plastic and may be joined together after molding or comolded together of the same or different plastic materials. The entire shoe and blade portions of the skate may also have their entire outer surfaces coated with synthetic diamond material with or without an overcoating as described above. Hard wax applied to such synthetic diamond coating may suffice to protect it against abrasion and wear as may a thin film of plastic spray or vapor deposited thereon.

Leather and plastic sheet materials may be similarly treated and coated with synthetic diamond film with or without a wax or plastic overcoating to define or cover and variety of products subject to scuffing or wear and/or requiring sealing against moisture and chemical attack.

In FIG. 2 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitabide hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my U.S. patent application Ser. No.

32,307, now U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001″ to .001″ or more may be provided to substantially enhance the tensile and compressive strengths of the articles or components. When the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Certain modifications to the structures and methods for making same may be found in my parent application serial number 32,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer surface or surfaces of the articles to the exclusion of another area or areas thereof for functional and/or economic purposes. Such an electron beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubricate and protect the surface of the synthetic diamond coating.

4. Coatings formed of a plurality of layers of synthetic diamond material formed as described between respective layers of the same or different metals, metal alloys and/or ceramic materials may be employed to enhance the physical, chemical resistance and electrical characteristics of the articles described. Such multiple coatings may also be employed to substantially enhance the strength and stiffness of the articles.

With the above and such other objects in view as may hereafter more fully appear, the invention consists of the novel structures, article constructions and methods described in the specification and illustrated in the drawings, but it is to be understood that changes, variations and modifications may be resorted to which fall within the scope of the invention as claimed without departing from the nature and spirit of the invention.

Figure 3:
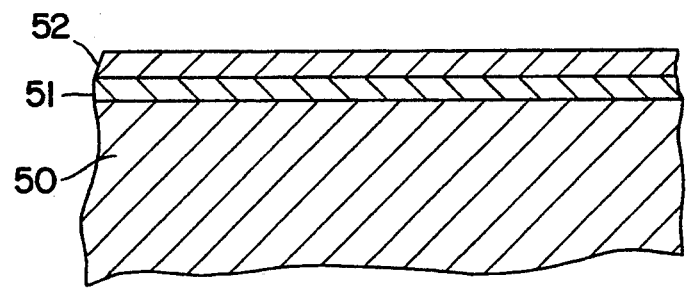
FIG. 3 is a cross sectional view of a fragment of a typical blade or runner formed of a substrate having two materials coated thereon, one of which is formed in situ thereon of carbon atoms defining a hard surfacing layer with a hardness in the range of natural diamond and defines a synthetic diamond-like material.

The composite structures illustrated in FIGS. 2 and 3 may also define details and portions of cutting tools the cutting surface or surfaces of which are coated with synthetic diamond film as described and, in certain instances, overcoated with a solid lubricating protective layer of chromium or other metal such as a vanadium, tungsten, titanium, aluminum, molybdenum or other suitable metal or alloy of same which serves to protect the surface of the diamond coating against attrition and to protect and lubricate same during use. FIG. 2 may comprise, for example, a portion of a cutting tool having a substrate 21 formed of a high strength metal, ceremet or other crystalline material, and having either or both the edges 28,29 thereof defining one or a plurality of cutting edges of the tool. A thin layer 51 of synthetic diamond material is deposited against and coats either the entire substrate 21 as shown or select portions of the side wall surfaces 25 and 26 as well as the end face 27 of the substrate. Such diamond layer 51 extends over and around the cutting edge portions 28 and 29 and its outer surface defines the cutting edge or edges of the tool where the film sharply changes directions as such edge portions. If a hard dry lubricating material is deposited as a layer 52 against the entire outside surface of the diamond layer or for select distances adjacent either or both edges 28,29, its outer surface may define the cutting edge or edges of the tool. Such lubricating protective layer 52 may comprise chromium or any of the metals or alloys mentioned above and may be replenished from time to time by removal of the tool from its tool holder or while held thereby away from or on the machine which operates with such tool. The tool may be in the form of a drill bit, cutting insert, milling tool, saw blade, knife blade, jaw portions of a wire cutter, or a bit for a grinding tool. The synthetic diamond layer as well the overcoating of protective and lubricating material may be deposited in thicknesses varying from 0.0001" to 0.005" thick or greater depending on tool size and performance requirements.

FIG. 2 may also represent a portion of a flexible substrate 52 made of a plastic resin such as a suitable polymer or copolymer; random or aligned fibers such as paper made from woodpulp or other material or woven material such as a cloth, canvas or reinforcement for a composite material such as carboncarbon having either or both major surfaces thereof coated with synthetic diamond material formed in situ thereon by chemical vapor deposition utilizing microwave energy to strip carbon atoms from molecules of a hydrocarbon liquid or gas such as methane by means such as described above and in my copending U.S. patent application Ser. No. 032,352 and U.S. Pat. No. 4,859,493.

In a particular embodiment of the structure of FIG. 2 the substrate 52 may comprise a sheet of fibrous material such as paper or paperboard, canvas or the like having either or both the major surfaces thereof coated with a thin film of synthetic diamond material and having a valuable painting or print of art rendered on one of the surfaces thereof. The following forms of the invention are noted:

1. In a first form of the invention, the substrate 52 is a sheet of flexible or rigid fibrous material, such as paper or paperboard, canvas or the like containing printing material such as printing ink or painting material such as paint in the form of painting oils, acrylic or other material represented by the layer 51 which may or may not be absorbed into the surface stratum of substrate 51 as in most painted works of art. Layer 50 which is. formed in situ and deposited on the outer surface of paint layer 51 or directly against the outer surface of substrate 52 is a thin film of synthetic diamond material which serves to protect the painting and the substrate from degradation due to atmospheric chemicals. The synthetic diamond material may be deposited as a thin transparent film in the range of thicknesses between 0.000001" to 0.0001" and is preferably although not necessarily less than about 0.00001" in thickness. While the synthetic diamond film may be utilized per se to protect the outer surface of the painting from chemical attack and to prevent cracking of the paint as it ages, it may also be overcoated with a thin coating of a plastic resin such as a suitable polymer or copolymer which may be utilized to protect the outer surface of the diamond film from abrasion and reduce its possibility of failure therein such as cracking during handling or mounting same of a support. If fine voids or pin holes occur in such synthetic diamond film during its formation, such plastic film or coating may be employed to fill or cover such voids and strength and flexibility to the laminate without adversely affecting the painting or print. However, the synthetic diamond film may be utilized per se to protect substantially the entire painting or print from chemical degradation, particularly if such print or painting is supported in a frame behind a sheet of glass or rigid plastic.

2. In a second form of the invention a laminate is first formed of a sheet substrate 52 made of fibrous material such as paper, paperboard, canvas or the like and has one of its major surfaces .52S on which printed matter or a painting of value is to be made by an artist, coated with a thin layer or film 51 of synthetic diamond material formed in situ thereon as described by stripping carbon atoms from carbon atom containing molecules with microwave energy as described. The painting or print is then applied to the outer surface of the diamond film which may vary in thickness from a few millionths of an inch to a thousandth of an inch or more. A thin coating of clear or white colored plastic resin may be automatically applied to the outer surface of the diamond film onto the outer surface of which plastic may be printed or hand painted artwork or the like. The diamond film serves as a barrier against moisture and chemicals which may be present in or pass through the paper or paperboard substrate. After the painting or printed matter is completely applied to the outer surface of the first layer of synthetic diamond or a subsequent layer of plastic resin thereon, a second layer of synthetic diamond material is formed in situ against the outer surface of the painting or print completely covering all the printed matter or paint and exposed plastic of first layer of synthetic diamond laminating the paint or printed matter and hermetically sealing same therebetween.

3. In a third form of the invention a thin layer or film of synthetic diamond material is applied as described to the back of a sheet of paper, canvas or other suitable material either prior to or after printed matter or a painting has been formed on on the opposite surface thereof. Once the printed matter or paint forming a work of art has been so applied to the other surface of the sheet, a thin coating of synthetic diamond material is applied thereover including any exposed surface portion(s) of the sheet not printed or painted on. In other words, the entire other surface of the print or painting is coated with synthetic diamond material as described. The coating on the back side of the sheet seals the sheet itself from the atmosphere and moisture therein as well as any pollutants preventing same from adversely affecting both the sheet or paper and the printed matter or paint on the other surface thereof. The synthetic diamond coating on the front face of the painting or print seals such surface and hermetically seals the painting, print and paper or canvas between itself and the synthetic diamond material coating the opposite side thereof. The outer surface of the thin layer of synthetic diamond material, which may be applied in the range of thicknesses described above to the outer surface of the painting or print may remain diamond film or may be overcoated with a thin layer of transparent plastic as described above to enhance the strength of the laminate and protect the diamond film. Such plastic layer may be a preformed sheet of clear plastic film such as a polyester resin, polycarbonate, polyamide or Nylon, etc.

In the print or painting preservation structures and techniques described above, synthetic diamond film and/or clear plastic film may be applied to the four edges of the paper or canvas sheet to coat or impregnate same in a manner to seal same from moisture and atmospheric gases to prevent same from penetrating the laminate from the edges thereof. Tightly clamping the print or painting between a glass sheet and a backing sheet may serve the same purpose and may be used to preserve the print or painting for an extremely long period of time. Painting or printing on diamond film applied to a face of a sheet material will not only protect the paint or ink from interacting with chemicals in the paper or base sheet or with chemicals and moisture penetrating said sheet from the rear, but will also strengthen such sheet material and limit or prevent its stretching to the determent of the painting or print applied thereto.

4. In a fourth form of the invention, a laminate of a print or painting and one or more sheets of plastic and- /or glass sheet may have its entire outer surfaces coated with synthetic diamond material as described, thereby sealing such laminate in synthetic diamond material against moisture and atmospheric molecule penetration. If the laminate or a portion thereof is made of a porous material containing atmospheric molecules accessible to the surface(s) of the laminate, it may be placed in a chamber which may be evacuated of air just prior to application of the synthetic diamond coating which may be formed of atoms of carbon stripped from molecules of a hydrocarbon gas controllably fed into the vacuum chamber along with suitable hydrogen to the exclusion of contaminants such as air or other molecules until the coating process is complete.

A number of techniques and apparatus may be employed to coat paintings, prints and the like with synthetic diamond. In one, a waveguide for suitable microwave energy is automatically driven in controlled scanning movement across a surface of the painting, print or sheet while methane or other suitable hydrocarbon gas is flowed into the guide against the surface of the painting and suitable microwave energy is generated and passed through the guide to cause carbon atoms of the gas to be stripped from the gas molecules and deposited onto the surface of the painting or paper until predetermined coating is completed. In a second technique, the painting,print or its laminate as described above is placed and either held stationary or controllably moved in a coating chamber into which hydrocarbon gas (such as methane) is controllably flowed while suitable microwave energy is generated and directed against all or a selected location of the painting- In a third form, the microwave energy generator is moved or controlled to cause microwave energy to scan the sheet causing the scanning deposition of carbon atoms as synthetic diamond film on incremental portions of the painting or sheet. In a forth arrangement, the sheet, painting or print is rolled into a loose coil formation with suitable spacing between surface portions to allow methane gas or the like to be flowed through such spacing while microwave energy is directed against the coil formation to deposit carbon atoms as a film of synthetic diamond material of select thickness.

The substrate 52 may comprise a variety of natural or synthetic flexible materials such as paper, plastic sheet or film, parchment, canvas, leather, woven fabrics metal foils, laminates of such materials or such sheet materials coated with a suitable plastic layer or film against the outer surface of which the synthetic plastic material may be deposited as a thin film. Such laminates of flexible substrate sheet, and a plurality of coatings thereon including a first layer of plastic if needed to render the surface of the substrate non-porous, a layer of synthetic diamond material on the surface of the substrate or plastic coating thereon and an overcoating of flexible colored or transparent plastic or preformed plastic film, may be utilized to provide flexible material for a variety of products in which the synthetic diamond coating adds substantially to the strength and abrasion resistance. If the overcoating of plastic is omitted, the synthetic diamond layer itself may serve to offer great resistance to wear and scuffing or abrasion, add to the total strength of the flexible laminate and, in certain applications, serve as a heat insulating layer.

In yet another form of the invention, the composite blade constructions illustrated in FIGS. 2 and 3 of the drawings and described above as applicable to ice skate blades may also be applied to ski edging or other sporting equipment subject to abrasive and frictional wear during use, such as ski edging sleigh or sled runners and the like. For example, skis made of laminations of plastic and metal strips or sheets may have the latter completely coated with synthetic diamond film per se as described or just the border and edge portions thereof so coated with or without an overcoating of one of the types described above to provide the edging of the skis formed of such hard abrasion and frictional resistant materials and material combinations along the entire lengths of the side wall portions or side edges of the skis.

The entire runner or edge portion thereof of sleigh or sled runners subject to abrasive wear and attrition may also be similarly fabricated with synthetic diamond coatings with or without hard lubricating coatings of the types described.

Figure 4:
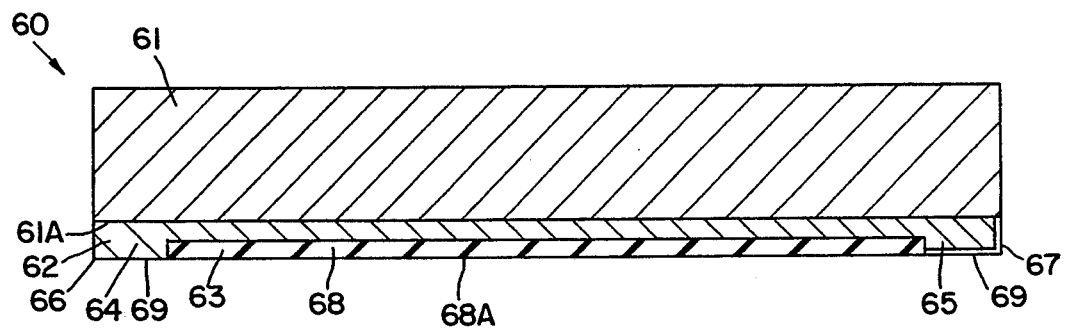
FIG. 4 is a cross sectional view taken normal to the longitudinal axis of a ski made of composite materials including a bottom plate extending the width of the ski and formed of metal which is completely or partly coated with a synthetic diamond material.

In FIG. 4 is shown a first form of ski construction embodying the invention. The ski Gala is formed of an upper laminate or base 62 of conventional construction containing one or more layers of the same or different plastic and, in certain instances, sheet metal, honeycomb or other composite materials (not shown). Bonded or welded to the bottom surface GAB of the laminate 61 is art elongated metal plate or sheet 62 extending the length of the laminate 61. A wide channel 63 ms formed when the plate 62 is fabricated and is filled with a suitable plastic sheet or strip G8 which is laminated thereto and provides a low friction lower surface 68A for sliding contact with snow. Lateral border portions 64 and 65 of the plate 62 provide respective right and left side edges 66 and 67 defining the lower edging of the ski which engage snow and ice and effect directional control during skiing. Notation 69 refers to a synthetic diamond coating or combination of coatings as described herein which may be applied to the entire outer surface of the plate 62, the exposed surfaces or just the border portions 64 and 65 thereof. Such synthetic diamond or composite coating thus defines the longitudinal lower edges 66 and 67 of the ski and may be employed per se as coated or may be sharpened by grinding and/or lapping after coating.

If the plate or strip 62 is provided without the central channel 63 formed therein and has its bottom and side wall portions or its entire outer surface coated with synthetic diamond material, the outer surface of such coating or a hard lubricating material overcoating same as described ,may be provided sufficiently smooth enough to eliminate the need to wax the bottom surface of the ski for use on snow.

If the sheet or plate 62 is provided of constant thickness without the channel 63, a sheet or coating of suitable plastic resin, such as polyethylene or polytetrafluorethylene, may be bonded to the central portion of the bottom surface thereof to provide a low friction bottom surface of the ski while the border portions of such metal sheet containing the edges 66 and 67 are maintained free of such plastic to provide hard, wear resistant edging.

Figure 5:
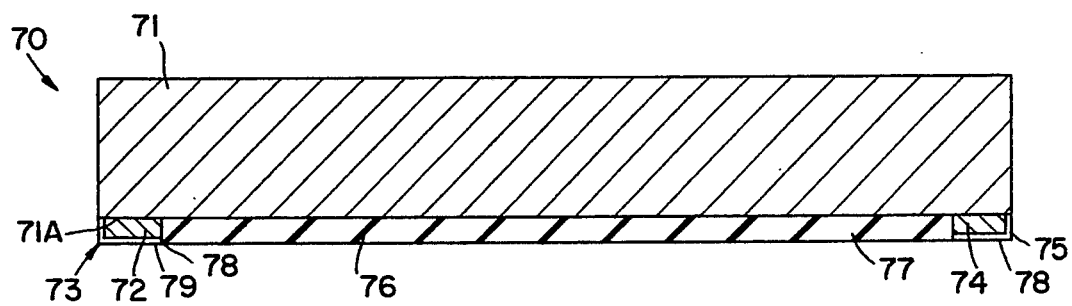
FIG. 5 is a cross sectional view taken normal to the longitudinal axis of a ski having strips made of or coated with synthetic diamond material and bonded to the left and right bottom border portions of a ski base, wherein the diamond material defines the left and right bottom edging of the ski.

In FIG. 5 is shown a modified form of snow ski or runner 70 defined by a ski base 71 which,like the base 61 may be formed of a single plastic molding or a laminate of a plurality of layers (not shown) ,of plastic strips or sheets and other reinforcincing materials. Bonded or welded to the lower surface 71A of the base 71 is a composite sheet or plate formed of a central strip or sheet 76 made of plastic resin or a laminate including one or more layers of the same or different plastics, the side walls of which sheet (76) are bonded to respective metal strips 72 and 74 which define the lower right and left borders of the ski. The metal strips 72 and 74 are each coated with respective layers 78 of synthetic diamond with or without a hard lubricating overcoating 79 of the types described herein.

Figure 6:
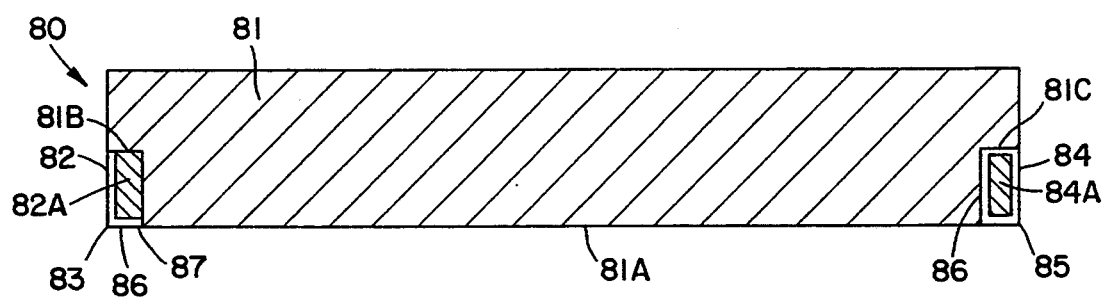
FIG. 6 is a cross sectional view taken normal to the longitudinal axis of a ski having left and right edge defining strips made of or coated with synthetic diamond and secured within recesses formed in the ski base or substrate.

In FIG. 6 is shown another form of ski construction employing diamond coated metal strips which cap or define at least the lower right and left wall portions of the ski. The ski 80 is defined by an elongated ski base 81 which is constructed of a single plastic molding or extrusion, or a laminate of strips or sheets of plastic, honeycomb and/or metal sheets. As in the embodiments of FIGS. 4 and 5, exact details of the construction of the ski base 81 are not shown as they are known in the art and vary substantially in production. Shown supported by the ski base 81 are respective strips 82 and 84 made of synthetic diamond coated metal or alloy, such as steel, titanium, aluminum, etc.

The composite edge defining strips 82 and 84 extend substantially the length of the ski 80 and preferably terminate at the front end of the ski at a metal toe (not shown) defining the lower wall portion of the front end of the ski. While both strips 82 and 84 are rectangular in cross section, as shown, and their inside and top walls contact and are adhesively bonded to respective walls of recesses 81B and 81C formed in the lower portions of the left and right borders of the ski base, it is noted that such strips may also define the complete left and right borders of the ski 80.

Two different constructions of the strips 82 and 84 are shown in FIG. 6. Strip 82 is formed of a base strip 82A of metal as described, the outer borders of which are coated with a synthetic diamond layer 86 which may or may not be overcoated with a thin layer 87 of metal as described, to protect the exposed surfaces of the synthetic diamond coating. The inside surfaces of the strip 82 are not so coated but are bonded directly to the walls of the recess 81B. Strip 84 is shown made of a core strip 84A of metal having a rectangular cross section. The two sidewalls, walls, top and bottom wall of the metal core strip 84A are coated with a synthetic diamond material 86 which may or may not be overcoated with chromium or other metal, as described, to lubricate and protect the diamond coating from attrition in use and widen filing, grinding or honing are employed to sharpen or maintain the left and right power edges of the ski sharp.

Further modifications to the ski and runner constructions shown in FIGS. 4 to 6 are noted as follows:

1. Either the entire metal plate 62 of the ski 60 of FIG. 4 may be coated with synthetic diamond or other hard surfaceing and wear resistant material to retain the lower edges 66 and 67 thereof sharp for substantially longer periods of time than metal edging per se or just select portions of such shaped metal plate or sheet adjacent edges 66 and 67 may be so coated to provide and define such edges made of such hard wear resistant material(s), 2. The border strips 72 and 74 of ski 70 of FIG. 5 may be secured by bonding and/or fasteners in respective recesses molded or machined along the lower left and right borders of the ski base 71 wherein sheet 76 is not present.

3. Strips 72 and 74 of FIG. 5 and 82 and 84 of FIG. 6 may have their inside surfaces irregularly shaped with one or more longitudinally extending channels or protruding ridges to enhance and improve their fastening to the ski base.

4. The composite strips 72,74 and 82,84 of FIGS. 5 and 6 may be replaced by strips formed of synthetic diamond material or the like.

5. The rectangular cross section strips of FIGS. 5 and 6 may be replaced by L (cross section) strips which are completely or partly coated with synthetic diamond or diamond-like material as described to define at least the lower outer edge portions thereof made of synthetic diamond.

6. The ski base may be formed of a lamination of layers of plastic sheet, honeycomb and metal strips or elongated sheet formations with the bottom layer of the ski base formed of a flat metal sheet 1/16" to ¼ thick and coated on its bottom surface with a hard surfacing material such as synthetic diamond. Such hard surfacing material may extend completely around all surfaces of the metal sheet, against just the lower surface thereof or against such lower surface and the side edges thereof to define low friction wear resistant bottom surface and edge portions.

Modifications to the blade and ski structures shown in FIGS. 1–5 may be made to define improved blades and runners for snow sleighs and sleds. Such runners are generally made of medical such as steel or iron which is cast or rolled to shape. If, for example, the core 21 of the blade of FIG. 2 or the substrate 50 of FIG. 3 comprise a sled or sleigh runner of steel, cast or forged iron or aluminum, the described synthetic diamond or diamond-like coatings with or without the described overcoatings may be employed to provide improved hard surfacings which resist frictional erosion and impact attrition during movement across ice and snow. Accordingly, a sleigh or sled runner or a runner or track employed in a machine as a slide, may have a construction similar to one of those described above and illustrated in FIGS. 1-3. Strips formed entirely of synthetic diamond may also be bonded to the bottom surfaces of runners and slides to provide both high wear resistance and strength for a runner, blade or slide for use in a sled,sleigh or machine component or track element.

What is claimed is:

1. (Amended) A ski for use on snow comprising in combination:
   a) a ski base having an elongated configuration and being substantially rectangular in cross section,
   b) elongated support means for hard surfacing material secured to said ski base and having side edge portions each of which is defined by respective horizontal and vertical surface portions which respectively extend substantially parallel to the bottom and side surfaces of said ski,
   c) said horizontal and vertical surface portions of said edge portions of said support means being coated with a hard surfacing material having a hardness in the range of diamond and formed in situ on said surface portions of carbon atoms stripped from carbon atom containing molecules of a fluid adjacent said surface portions of said elongated support means for said hard surfacing material, said hard surfacing material defining the lower left and right lateral edging of said ski, said hard surfacing material serving to impart high wear resistance to the lower left and right edge portions of said ski and to maintain the integrity and sharpness off the edging of said ski over an extended time of use which is substantially greater than the sharpness retained by the edging of skis formed with metal edging.

2. A ski in accordance with claim 1 wherein said elongated support means for said hard surfacing material comprises an elongated metal plate bonded to the bottom of said ski base and extends substantially the length thereof, the width of said metal plate being substantially the width of said ski base.

3. A ski in accordance with claim 2 including a low friction material bonded to the bottom surface of said elongated metal plate and defining most of the bottom surface of said ski.

4. A ski in accordance with claim 3 wherein said low friction material bonded to the bottom surface of said ski base comprises said hard surfacing material.

5. A ski in accordance with claim 1 wherein said hard surfacing material comprises synthetic diamond.

6. The ski in accordance with claim 1 wherein said elongated support means for said hard surfacing material comprises an elongated flexible plate extending substantially the width of said ski base and bonded to the bottom surface of said ski base, a centrally located channel formed in the bottom surface of said plate and plastic material filling said channel and defining the central portion of the lower surface of said ski.

7. A ski in accordance with claim I wherein said elongated support means for hard surfacing material comprises two pair of metal strips, each bonded respectively to the lower left and right border portions of said ski base along substantially the length thereof.

8. A ski in accordance with claim 7 wherein said ski base is shaped with recesses formed along the lower left and right borders thereof, in which recesses respective of said metal strips are retained and are supported, each of said metal strips having an outer lower edge defined by intersecting surfaces which are coated with said hard surfacing material, said hard surfacing material comprising synthetic diamond material formed in situ against the adjacent outwardly extending surfaces of said metal strips.

9. A ski in accordance with claim 1 wherein said elongated support means for said hard surfacing material comprises a pair of elongated flexible strips bonded to the bottom surface of said ski base along the lower left and right borders thereof, and a sheet of low friction plastic secured to the bottom surface of said ski base and filling the space between said strips.

10. A ski in accordance with claim 1 wherein said support means for said hard surfacing material comprises said ski base, said hard surfacing material being in the configuration of a sheet secured against and extending across the bottom surface of said ski base.

11. A ski for use on snow comprising in combination:
a) a ski base having an elongated configuration,
b) said ski base having a substantially rectangular cross sectional shape,
c) select portions of the lower left and right side walls of said ski comprising a synthetic diamond material formed by the chemical vapor deposition of atoms of carbon stripped from molecules containing said carbon atoms as respective coatings of angular shape against said select portions of the lower left and right side walls of said ski.

12. A ski in accordance with claim 11 wherein said synthetic diamond material is in the form of elongated narrow strip-like formations of synthetic diamond.

13. A ski in accordance with claim 12 including respective strips of metal to which said strip-like formations of synthetic are bonded, said strips of metal being respectively secured to left and right side portions of said ski base.

14. A ski in accordance with claim 13 wherein said strips of metal are bonded directly to said ski base.

15. A ski in accordance with claim 11 wherein said synthetic diamond material is bonded directly to said ski base.

16. A ski in accordance with claim 11 wherein said ski base is formed of a laminate of a plurality of layers of different materials defining respective street-like formations of metal and plastic, the bottom sheet-like formation of said laminate having said synthetic diamond material defining select portions of the side walls and the bottom wall thereof and defining the lower left and right edges of said ski.

17. A ski in accordance with claim 13 wherein said strips of metal have their outer longitudinally extending surfaces completely coated with synthetic diamond.

18. A ski for use on snow comprising:
a) a ski base having an elongated shape with a substantially rectangular cross sectional configuration,
b) a ski base formed of a laminate of a plurality materials including at least one layer of plastic resin,
c) said ski having lower left and right edge portions which are operable during skiing on snow to cut into and define a track through said snow,
d) said lower left and right edge portions and select strip-like portions of the bottom and intersecting lower side wall surfaces of said ski being coated with a hard synthetic diamond-like material.

19. A ski in accordance with claim 18 wherein the central portion of the bottom wall of said ski is surfaced with a low friction plastic resin.

20. A ski in accordance with claim 18 wherein the entire bottom surface of said ski is defined by synthetic diamond-like material.

* * * * *